(12) United States Patent
Shicong et al.

(10) Patent No.: US 10,770,997 B2
(45) Date of Patent: Sep. 8, 2020

(54) POWER SYSTEM

(71) Applicants: ROLLS-ROYCE plc, London (GB); MTU FRIEDRICHSHAFEN GMBH, Friedrichshafen (DE); MTU ONSITE ENERGY GMBH, Augsburg (DE)

(72) Inventors: Yang Shicong, Singapore (SG); Souvik Dasgupta, Singapore (SG); Michael Kreissl, Friedberg (DE); Johannes Demharter, Friedrichshafen (DE); Amit K Gupta, Singapore (SG)

(73) Assignees: ROLLS-ROYCE plc, London (GB); MTU FRIEDRICHSHAFEN GMBH, Friedrichshafen (DE); MTU ONSITE ENERGY GMBH, Augsburg (DE)

( * ) Notice: Subject to any disclaimer, the term of this patent is extended or adjusted under 35 U.S.C. 154(b) by 0 days.

(21) Appl. No.: 16/401,570

(22) Filed: May 2, 2019

(65) Prior Publication Data

US 2019/0372494 A1 Dec. 5, 2019

(30) Foreign Application Priority Data

May 30, 2018 (GB) .................................. 1808796.5

(51) Int. Cl.
*H02P 9/10* (2006.01)
*H02K 19/36* (2006.01)
*H02P 9/00* (2006.01)

(52) U.S. Cl.
CPC ............. *H02P 9/102* (2013.01); *H02K 19/36* (2013.01); *H02P 9/006* (2013.01); *H02P 9/009* (2013.01)

(58) Field of Classification Search
CPC ........ H02P 99/006; H02P 9/009; H02P 9/102; H02K 19/36
USPC ......................................... 322/10, 28; 290/31
See application file for complete search history.

(56) References Cited

U.S. PATENT DOCUMENTS

| | | | | |
|---|---|---|---|---|
| 4,467,267 | A | * | 8/1984 | Hucker ..................... H02P 9/36 322/61 |
| 4,772,802 | A | * | 9/1988 | Glennon ................. F02N 11/04 290/31 |
| 4,868,406 | A | * | 9/1989 | Glennon ................. F02N 11/04 290/4 R |
| 4,994,684 | A | * | 2/1991 | Lauw ....................... H02P 9/42 290/40 C |

(Continued)

FOREIGN PATENT DOCUMENTS

| GB | 2519116 A | 4/2015 |
|---|---|---|
| WO | 2008/102105 A1 | 8/2008 |

(Continued)

OTHER PUBLICATIONS

Oct. 7, 2019 Extended Search Report issued in European Patent Application No. 19171873.3.

(Continued)

*Primary Examiner* — Pedro J Cuevas
(74) *Attorney, Agent, or Firm* — Oliff PLC

(57) ABSTRACT

A power system includes a synchronous electrical generator having a rotor driven by a shaft; a permanent magnet signaling generator, coupled to the shaft; and an angle computation unit configured to calculate a rotor angle or load angle based on a voltage from the permanent magnet signaling generator and a voltage from the synchronous electrical generator.

15 Claims, 4 Drawing Sheets

(56) References Cited

U.S. PATENT DOCUMENTS

| | | | | |
|---|---|---|---|---|
| 5,013,929 A * | 5/1991 | Dhyanchand | ........... | F02N 11/04 290/31 |
| 5,015,941 A * | 5/1991 | Dhyanchand | ........... | F02N 11/04 290/38 R |
| 5,068,590 A * | 11/1991 | Glennon | ................ | F02N 11/04 290/38 R |
| 5,140,245 A * | 8/1992 | Stacey | ................ | G08C 19/42 318/723 |
| 5,384,527 A * | 1/1995 | Rozman | ................ | F02N 11/04 318/254.2 |
| 5,418,446 A * | 5/1995 | Hallidy | ................ | H02K 19/28 322/28 |
| 5,430,362 A * | 7/1995 | Carr | ...................... | F02N 11/04 318/139 |
| 5,461,293 A * | 10/1995 | Rozman | ................ | F02N 11/04 318/603 |
| 5,493,200 A * | 2/1996 | Rozman | .................. | H02P 9/08 322/10 |
| 5,495,162 A * | 2/1996 | Rozman | ................ | F02N 11/04 290/39 |
| 5,495,163 A * | 2/1996 | Rozman | ................ | F02N 11/04 322/10 |
| 6,172,498 B1 * | 1/2001 | Schmidt | ............. | G01D 5/2006 318/685 |
| 7,301,310 B2 * | 11/2007 | Ganev | .................... | H02P 9/48 290/46 |
| 7,821,145 B2 * | 10/2010 | Huang | .................. | F02N 11/04 290/31 |
| 7,843,175 B2 * | 11/2010 | Jakeman | ................ | H02P 9/10 310/179 |
| 8,278,883 B2 * | 10/2012 | Dalby | .................. | H02P 9/009 322/20 |
| 8,593,095 B2 * | 11/2013 | Markunas | ................ | H02P 6/20 318/400.33 |
| 10,205,415 B2 * | 2/2019 | Blackwelder | ............ | H02P 9/14 |
| 2005/0216225 A1 * | 9/2005 | Anghel | ................ | H02P 6/181 702/151 |
| 2007/0222220 A1 * | 9/2007 | Huang | .................. | F02N 11/04 290/31 |
| 2009/0174188 A1 * | 7/2009 | Huang | .................. | F02N 11/04 290/46 |
| 2010/0039077 A1 * | 2/2010 | Dalby | .................... | H02P 9/009 322/59 |
| 2012/0050053 A1 | 3/2012 | Kim | | |
| 2016/0357207 A1 | 12/2016 | Desabhatla | | |
| 2017/0170764 A1 * | 6/2017 | Blackwelder | ............ | H02P 6/20 |
| 2017/0176222 A1 | 6/2017 | Hosseini Dastjerdi et al. | | |
| 2018/0102725 A1 | 4/2018 | Fahringer et al. | | |
| 2019/0173403 A1 * | 6/2019 | Blackwelder | ............ | H02J 3/40 |
| 2019/0288624 A1 * | 9/2019 | Gupta | ...................... | H02P 3/22 |

FOREIGN PATENT DOCUMENTS

| | | |
|---|---|---|
| WO | 2011/070520 A2 | 6/2011 |
| WO | 2013/102849 A2 | 7/2013 |
| WO | 2017/214499 A1 | 12/2017 |

OTHER PUBLICATIONS

Jan Turcek et al. "Estimation of Load Angle Using Measured Parameters of Synchronous Machine". Elektro, 2012, IEEE, May 21, 2012, pp. 270-273.

Aug. 23, 2019 Search Report issued in European Patent Application No. 19171872.

Sep. 2, 2019 European Search Report issued in European Patent Application No. 19171871.7.

Nov. 20, 2018 Search Report issued in British Patent Application No. 1808797.3.

Nov. 23, 2018 Search Report issued in British Patent Application No. 1808798.1.

Nov. 15, 2018 Search Report issued in British Patent Application No. 1808796.5.

IEEE Tutorial on the Protection of Synchronous Generators (second edition), Aug. 29, 2011, URL: <http://resourcecenter.ieee-pes.org/pes/product/tutorials/PESTP1001>.

Tomislav Idzotic et al. "Synchronous Generator Load Angle Measurement and Estimation". Automatika, vol. 45, No. 3-4, 2004, pp. 179-186.

D. Sumina et al. "Determination of Load Angle for Salient-Pole Synchronous Machine". Measurement Science Review, vol. 10, No. 3, 2010, pp. 89-96.

U.S. Appl. No. 16/401,638, filed May 2, 2019 in the name of Johannes Demharter et al.

U.S. Appl. No. 16/401,543, filed May 2, 2019 in the name of Souvik Dasgupta et al.

* cited by examiner

POWER SYSTEM

The present disclosure relates to the determination of a load angle and/or rotor angle in an electrical power generator driven by prime mover, such as reciprocating engine or gas/steam/wind turbine or motor etc. for a power grid application. The techniques disclosed herein provide accurate determination of the load angle and/or rotor angle during high load conditions and also during transient periods when a fault has caused magnetic saturation of the generator. The techniques disclosed herein are therefore particularly appropriate for detecting when an out-of-step condition has occurred.

There is a general need to improve known load angle and/or rotor angle determination techniques.

According to a first aspect of the present invention there is provided a power system, comprising: a synchronous electrical generator having a rotor driven by a shaft; a permanent magnet signalling generator, coupled to the shaft; and an angle computation unit configured to calculate a rotor angle and/or load angle based on a voltage from the permanent magnet signalling generator and a voltage from the synchronous electrical generator. This approach provides a cheap and reliable way of determining the load and/or rotor angle.

The number of magnetic poles in the permanent magnet signalling generator can be the same as a pole number of the rotor of the synchronous electrical generator. The number of phases of the permanent magnet signalling generator can be the same as a number of phases in a stator of the synchronous electrical generator. Magnetic poles of the permanent magnet signalling generator can be aligned with magnetic poles of the synchronous electrical generator.

The angle computation unit can be configured to calculate the rotor angle or load angle in one or both of steady state and transient conditions.

The angle computation unit can be configured to: receive the voltage from the permanent magnet signal generator at a first resistor via a variable resistor, receive the voltage from the synchronous electrical generator at a second resistor, first ends of each of the first and second resistors being connected to each other and ground, adjust the value of the variable resistor until the voltages over the first resistor ($V_{a,snl}$) and over the second resistor ($V_{a,ppc/t}$) are equal, and calculate an angle ($\delta$) using the equation:

$$\delta = \cos^{-1}\left(\frac{V_{a,snl}^2 + V_{a,pcc/t}^2 - V_{ag}^2}{2 \cdot V_{a,nsl} V_{a,pcc/t}}\right)$$

wherein $V_{ag}$ is the voltage between the un-earthed ends of the first and second resistors. This approach provides robust angle determination during steady state.

The angle computation unit can comprise a digital signal processor. The digital signal processor can be configured to: receive a three phase voltage from the permanent magnet signal generator), and determine a voltage angle ($\theta_{snl}$) for the permanent magnet signal generator; receive a three phase voltage from the synchronous electrical generator, and determine a voltage angle ($\theta_{pcc/t}$) for the synchronous electrical generator; and calculate an angle ($\delta$) as the difference between the voltage angle ($\theta_{snl}$) for the permanent magnet signal generator and the voltage angle ($\theta_{pcc/t}$) for the synchronous electrical generator. This approach provides a way to determine rotor and/or load angles that it is independent of voltage magnitude, and therefore is reliable even during transitional state operation of the power system (e.g. following a fault).

The electrical power output from the synchronous electrical generator can be less than 30 MW.

The voltage from the synchronous electrical generator can be the voltage ($V_{pcc}$) at the point of common coupling to a load attached to the synchronous electrical generator or the voltage ($V_t$) at an output terminal of the synchronous electrical generator.

According to a second aspect of the invention, there is provided a method of determining a rotor angle or load angle ($\delta$) in a power system comprising synchronous electrical generator, the method comprising calculating the rotor angle or load angle ($\delta$) based upon a voltage from a permanent magnet signalling generator coupled to a rotor shaft of the synchronous electrical generator.

The power system in the second aspect can be a power system according to the first aspect.

According to a third aspect of the invention, there is provided a method of determining whether or not an out-of-step condition has occurred, the method comprising: determining a load angle and/or rotor angle ($\delta$) of a generator system according to the method of the second aspect; and determining whether or not an out-of-step condition has occurred depending upon the determined load angle and/or rotor angle ($\delta$).

According to a fourth aspect of the invention, there is provided a computer program that, when executed by a computing device, causes the computing device to determine a load angle and/or rotor angle ($\delta$) in a power system according to the method of the third aspect and/or an out-of-step condition according to the method of the fourth aspect.

According to a fifth aspect of the invention, there is provided a computing device configured to determine a rotor angle ($\delta$) in a power system and/or an out-of-step condition by executing the computing program of the fourth aspect.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

Embodiments will now be described by way of example only, with reference to the figures, in which.

Figure 1:
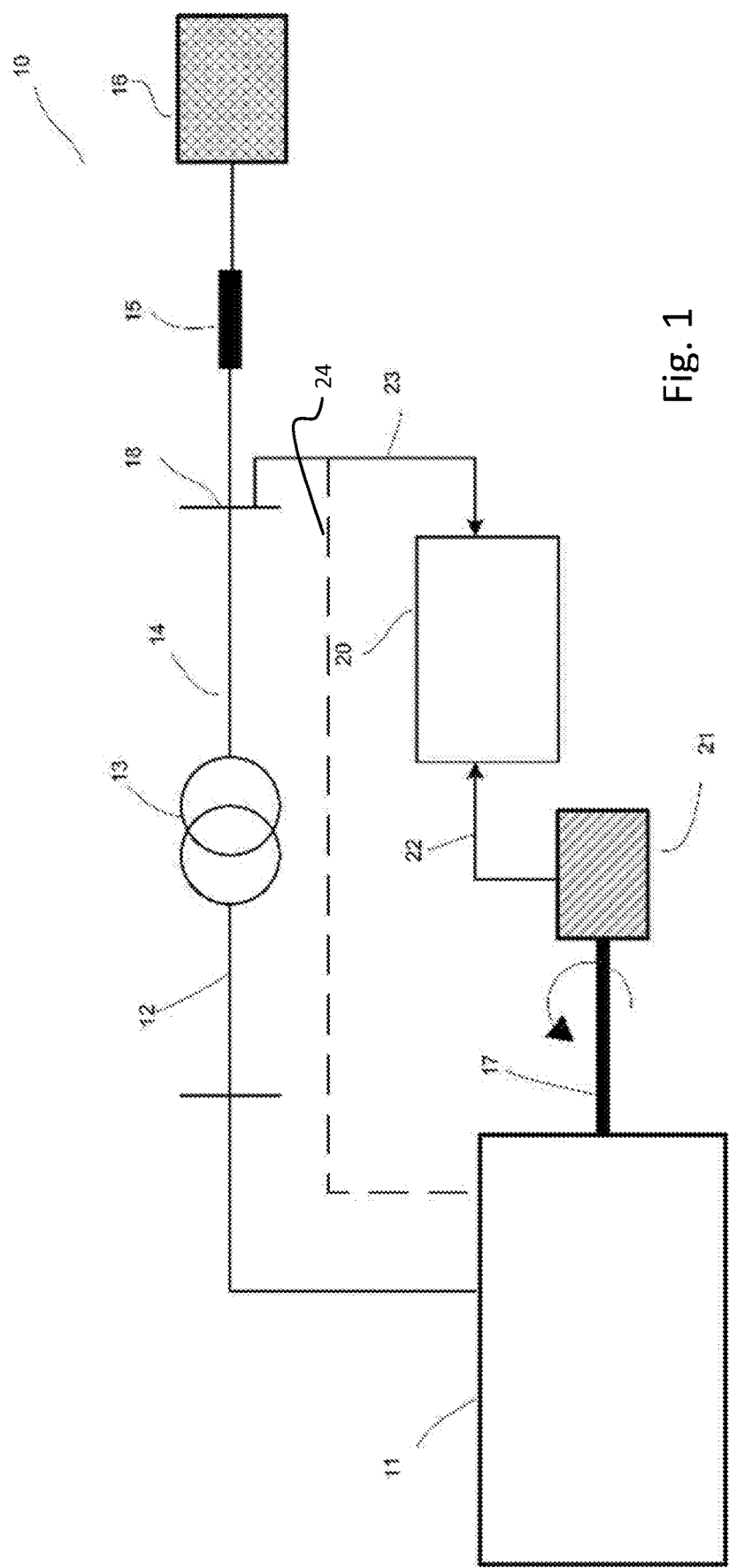
FIG. 1 shows the components of a power system according to an embodiment.
Figure 3:
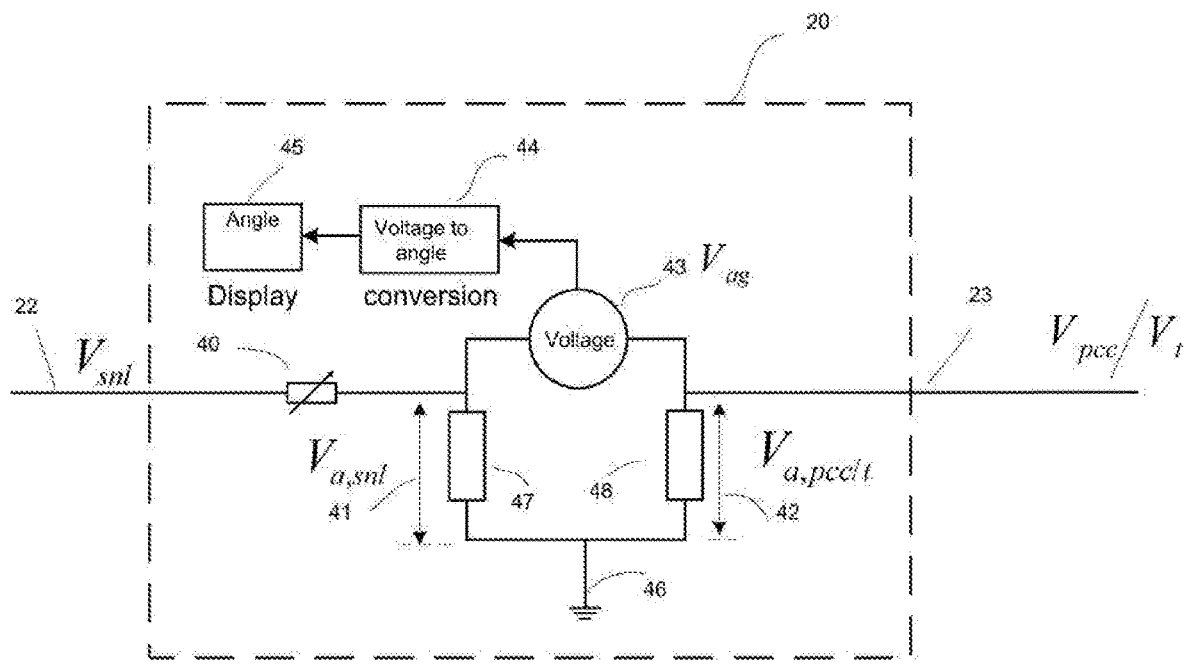
FIG. 3 illustrates a first arrangement for an angle calculating unit.
Figure 4:
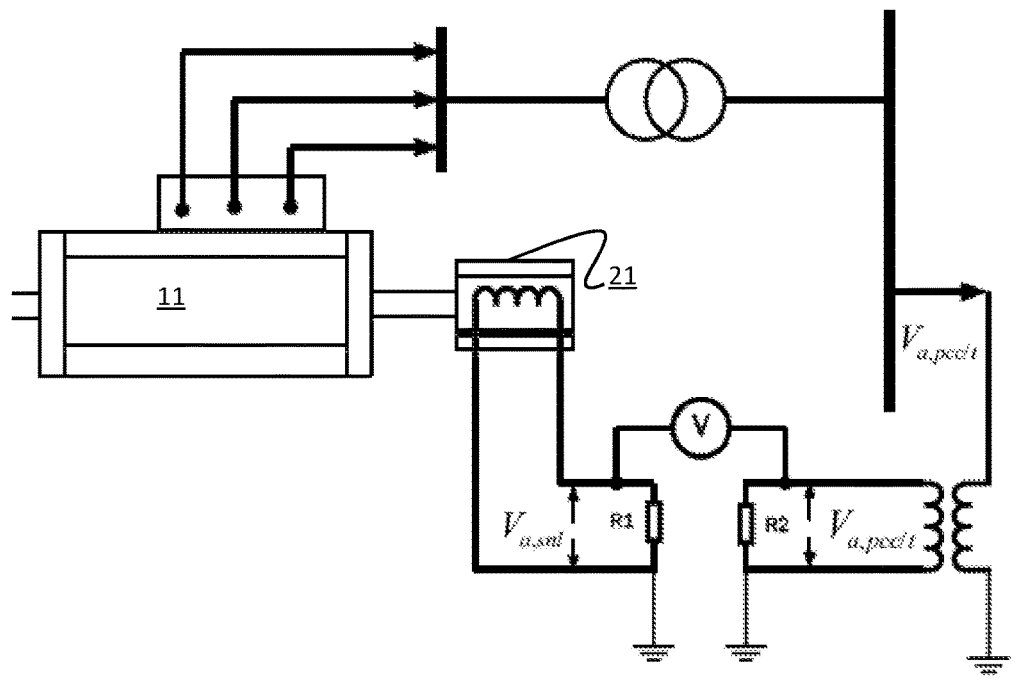
Figure 5:
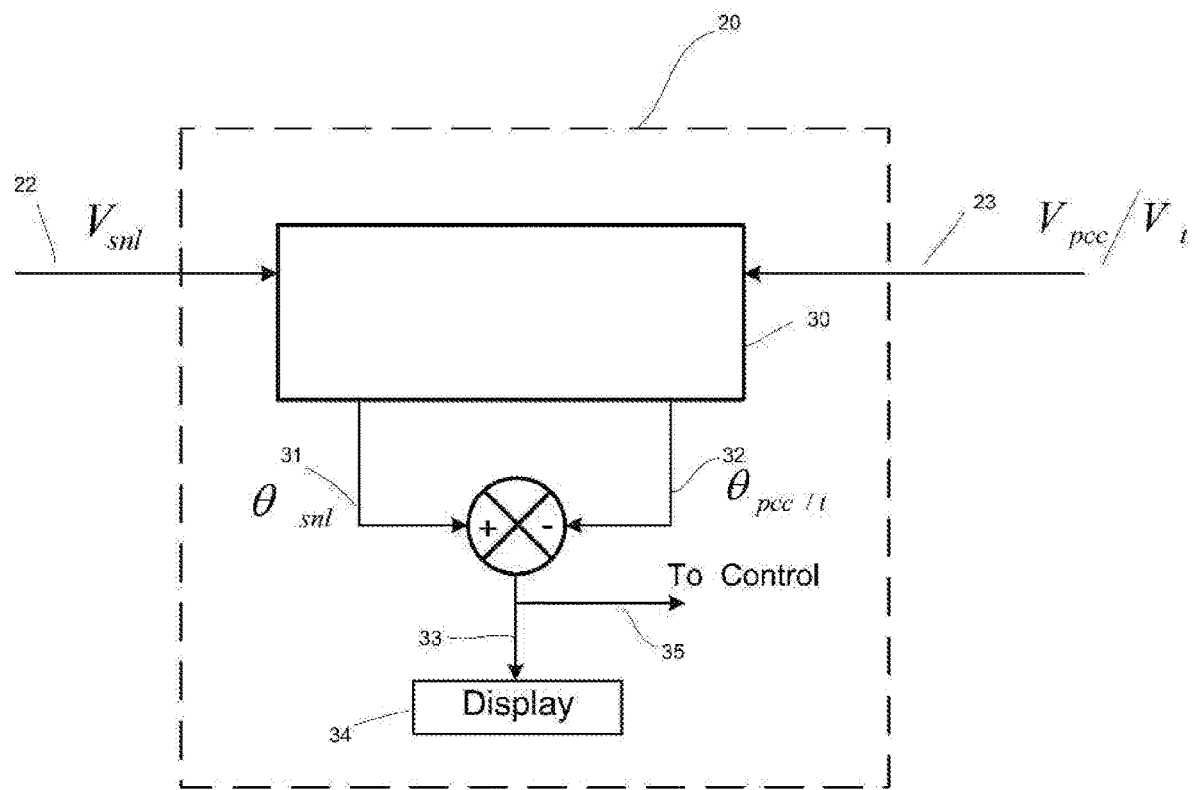

FIG. 4 demonstrates how the angle calculating unit of FIG. 3 operates in a power system such as that of FIG. 1;

FIG. 5 illustrates a second arrangement for an angle calculating unit; and

Figure 6:
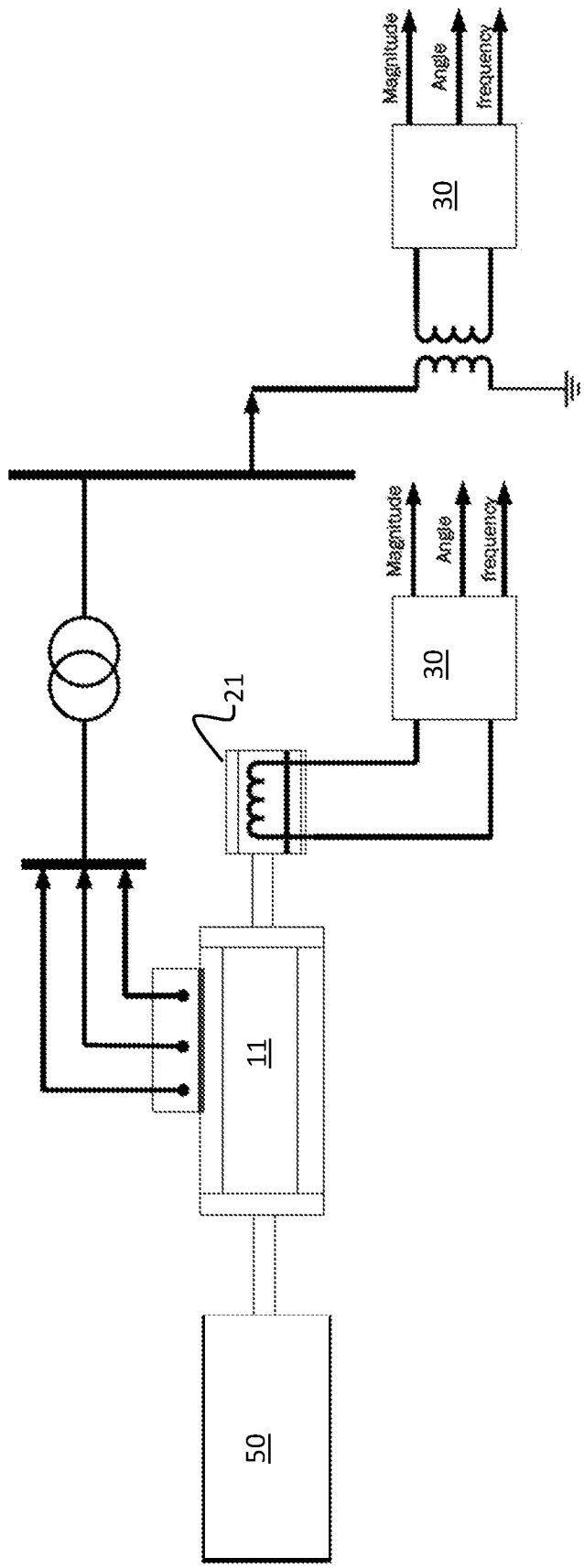

FIG. 6 demonstrates how the angle calculating unit of FIG. 5 operates in a power system such as that of FIG. 1.

The present disclosure provides an improved method of determining the load angle and/or rotor angle in a power system.

In order to clearly present the context of the present disclosure, details of background technology are provided below.

Electrical power systems are exposed to a variety of abnormal operating conditions such as faults, generator loss, line tripping, and other disturbances that can result in power oscillations and consequent system instability. Under these conditions, appropriate relay settings are essential to ensure proper protection (i.e., the disconnection of generators that lose synchronism and the blocking of undesired operation of distance relays associated with high-voltage, HV, lines).

During normal operating conditions, the electric power output from a generator produces an electric torque that balances the mechanical torque applied to the generator rotor shaft. The rotor runs at a constant speed with the electric and mechanical torques balanced. When a fault occurs, the amount of power transferred is reduced, which thereby reduces the electric torque that counters the mechanical torque. If the mechanical power is not reduced during the fault, the generator rotor will accelerate due to the unbalanced torque condition.

During an unstable power condition, at least two generators that provide power to a power grid rotate at different speeds to each other and lose synchronisation. This is referred to as an out-of-step condition (also referred to as a loss-of-synchronism condition or an out-of-synchronous condition).

An out-of-step condition causes high currents and mechanical forces in the generator windings and high levels of transient shaft torques. The torques can be large enough to break the shaft of a generator. Pole slipping events can also result in abnormally high stator core end iron fluxes that can lead to overheating and shorting at the stator core ends. The unit transformer will also be subjected to very high transient winding currents that impose high mechanical stresses on the windings.

Accordingly, if an out-of-step condition occurs, it is important that the generator or system areas operating asynchronously are quickly isolated from each other using out-of-step protection techniques.

Out-of-step protection is described in detail in at least: IEEE Tutorial on the Protection of Synchronous Generators (second edition), posted on 29 Aug. 2011, see http://resourcecenter.ieee-pes.org/pes/product/tutorials/PESTP1001 (as viewed on 14 Mar. 2018).

For a large power generation system, it is standard for an out-of-step detector, such as an impedance relay, to be used to determine if the generator is correctly synchronised with the power grid. However, out of step detectors are not normally provided for small synchronous generators, i.e. generators with a power output of less than 30 MW.

A particularly appropriate application for small synchronous generators is in smart grids. These are power grids with a variable number of power sources and adaptable power output from the power sources. Another particularly appropriate application for small synchronous generators is in micro grids. It is therefore desirable for small synchronous generators to be provided with out-of-step protection at a much lower cost than the out-of-step detection and prevention techniques that are currently used with large power generation systems.

A way of determining if a generator is operating correctly, or if an out-of-step condition has, or is about to, occur, is by determining and monitoring the rotor angle and/or the load angle of the generator. An accurate and low cost technique for determining the rotor angle and/or load angle of a generator is therefore desired.

A known and low cost technique for estimating the load angle of a generator is disclosed in D. Sumina, "Synchronous Generator Load Angle Measurement and Estimation", AUTOMATIKA 45 (2004) 3-4, 179-186. This technique allows the load angle to be estimated from the measured output voltages and currents. However, the estimation of the load angle is dependent on reactances in the system. This technique is therefore not accurate during a fault transient period when the high current causes magnetic saturation in the generator, transformer and measuring coils. Accordingly, this technique is only suitable for the estimation of load angle when the system is in steady state operation and it cannot be used to estimate the load angle during the transient period for out-of-synchronous protection. In addition, the accuracy of this technique also decreases when there is a change in saturation in the alternator core due to a variation of the power required to a load.

Another known technique for estimating the load angle of a generator is disclosed in D. Sumina, "Determination of Load Angle for Salient-pole Synchronous Machine", MEASUREMENT SCIENCE REVIEW, Volume 10, No. 3, 2010. The load angle is measured using an optical encoder and digital control system.

Disadvantages of this technique include the need to modify the generator design to incorporate the additional components of an optical encoder and sensor. This increases costs. A no-load angle calibration is also required after each synchronisation.

The present disclosure provides a new method of determining a load angle and/or rotor angle in a synchronous electrical power generator for a power grid.

The disclosed technique differs from known techniques by using a permanent magnet signal generator which allows novel voltage difference and space vector computation processes to be used.

Advantages include accurate determination of the load angle and/or rotor angle both during steady state operation, during the transient period for out-of-synchronous protection and/or under high load conditions. In addition, the disclosed technique can be implemented at a low cost because the additional components can be attached to the rotor shaft of the main generator shaft extension without any need to change the main generator circuit and terminals itself. Further, because the signalling generator is driven by the same shaft as the rotor of the main generator, no external power supply is required in obtaining the rotor position signal for the power generator. This reduces the risk of power supply failure. This approach provides a relatively high signal voltage, with the voltage only being dependent on the rotor speed. Low noise interference is therefore experienced, with high signal voltage and low voltage variation being obtained due to low speed variation. Moreover, there is also disclosed a technique for angle measurements that is reliant only upon measured voltage angles, rather than voltage magnitudes. As such, even if the magnet strength reduces after prolonged operation, rotor/load angle measurement is unaffected since the approach is independent of voltage magnitude.

FIG. 1 shows a power system 10 according to an embodiment.

The power system 10 comprises a synchronous electric generator 11. The generator 11 is driven by a prime mover 50 (not shown in FIG. 1, but e.g. see FIG. 6) such as a diesel or other reciprocating engine, or a gas/steam/wind turbine or a motor etc. The generator system 10 also has a unit transformer 13, to which the generator 11 is connected via input line 12. Transformer 13 has an output line 14 that connects to a point of common coupling (PCC) 18. That is, the unit transformer 13 is provided between the generator 11 and the PCC 18.

The engine 50 drives alternator shaft 17 that is arranged to drive a rotor of the generator 11 so that the generator 11 generates electrical power that is output from the generator 11, through the unit transformer 13, through the terminal PCC 18 and via a transmission line 15 that supplies the electrical power to a load 16, such as a power grid, motor or any type of device that consumes electrical energy. These components of the power system 10, and the operation of the power system 10, may be the same as for known power systems.

The load angle (also referred to as power angle, also referred to as rotor internal angle, or internal rotor angle) is defined herein as the angular difference between the open circuit voltage of the generator 11 (also referred to as the open circuit armature voltage, no load voltage, emf, back emf, induced emf or internal voltage of the generator 11) and the voltage at the output terminal of the generator 11.

The rotor angle is defined herein as the angular difference between the open circuit voltage of the generator 11 (also referred to as the open circuit armature voltage, no load voltage, emf, back emf, induced emf or internal voltage of the generator 11) and the voltage at the PCC 18.

By monitoring only the load angle, only the rotor angle or both the load and rotor angle, the performance of the power system 10 can be determined and an out-of-step condition detected depending on the operating conditions.

The power system 10 further comprises a permanent magnetic signalling generator (PMSG) 21. PMSG 21 is rigidly coupled with the shaft 17 of the synchronous power generator 11.

PMSG 21 is a permanent magnet synchronous generator of the type well known to the skilled person. In the power system 10, PMSG 21 is coupled to the same shaft 17 that drives the rotor of the synchronous power generator 11, and is used to produce an output voltage that acts as signal indicative of the rotor position of the synchronous power generator 11. PMSG 21 has the same number of the magnetics pole as the pole number in the rotor of the power generator 11, and the number of phases of the signalling generator 21 is also the same as the number of the phase in the stator of the power generator 11.

PMSG 21 is aligned with the power generator 11 at the time of first set-up. During alignment, the position of the magnetic poles of the PMSG 21 are arranged to be inline with the magnetic poles of the synchronous generator 11.

Preferably, during the alignment process, the power generator 11 is disconnected from all loads and the PMSG 21 is connected to high value resistors. The resistor value is preferably chosen so that the current flow in the PMSG 21 is negligible, and may be in the range of from several kΩ to MΩ.

Figure 2:
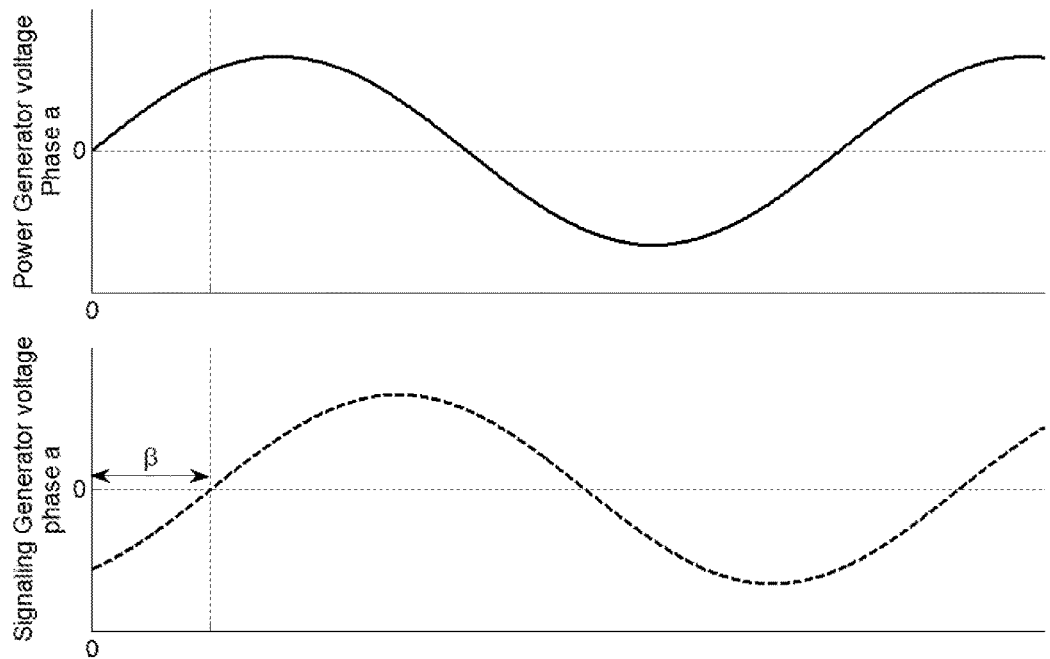
FIG. 2 shows example voltage traces.

The voltage waveforms at a phase 'a' from the unloaded power generator 11 output terminal and the PMSG 21 are obtained and displayed on a scope, for example. An output such as that illustrated in FIG. 2 might be seen. When the PMSG 21 and the synchronous generator 11 are properly aligned, the angle difference β for the voltage waveforms from the two sources should be zero. If the angle is not zero, the angular position of the PMSG 21 on the shaft 17 can be adjusted until the angle β is about zero. The correct alignment can be confirmed by testing the signals from the other phases.

Once the signalling generator 21 is aligned with the power generator 11, the rotor or load angle of the power generator 11 can be determined from the voltage signal at the terminal of the signalling generator 21. This determination is performed by a computing device, angle computation unit 20. Angle computation unit 20 receives the voltage 22 from the signalling generator 21 as a first input, and the voltage 23 from the point of common coupling 18 or the voltage from the terminal of the power generator, via line 24, as a second input. From these inputs, the rotor angle (utilising the signal from the PCC 18) or the load angle (utilising the signal from the terminal of the power generator) can be calculated. For the purposes of the calculations and equations below, the source of second input is not distinguished, but the skilled person will understand that the particular source will determine whether it is the load angle or rotor angle that is calculated.

A first approach to determining the rotor or load angle, particular during steady state operation, is now described with reference to FIGS. 3 and 4.

Angle computation unit 20 comprises a steady state angle determination circuit in which the voltage 22 ($V_{snl}$) from the terminal of the signalling generator 21 is supplied to a high value resistor 47 (which may have a value in the range of from several kΩ to MΩ) through a variable resistor 40, and the voltage from the PCC 18 ($V_{pcc}$) or output terminal of generator 11 ($V_t$) is supplied to another high value resistor 48. One end of each of the resistors 47 and 48 are connected to each other and to ground 46 to get a common reference. During steady state operation, the angle computation unit 20 is configured to adjust variable resistor 40 so that the voltage 41 ($V_{a,snl}$) across resistor 47 and the voltage 42 ($V_{a,pcc/t}$) across the resistor 48 are the same. When the voltages 41 and 42 are the same, the potential difference 43 ($V_{ag}$) between the un-earthed ends of the two resistors 47 and 48 is measured.

In vector space, the rotor or load angle δ is the angle between the voltages $V_{a,snl}$ and $V_{a,pcc/t}$, with $V_{ag}$ being the vector between $V_{a,snl}$ and $V_{a,pcc/t}$. As such, the angle δ can be computed using the cosine rule:

$$\delta = \cos^{-1}\left(\frac{V_{a,snl}^2 + V_{a,pcc/t}^2 - V_{ag}^2}{2 \cdot V_{a,nsl} V_{a,pcc/t}}\right)$$

The calculated angle δ can be output to a display 45 or other output type, for example.

The above method and calculation provides for a highly reliable and robust way of calculating the rotor angle or load at steady state, and no addition power connections are required to power the signal generator 21. By aligning the PMSG 21 with the generator 11 at the time of first set up, no further calibration is required, even after an out-of-step failure.

However, the method discussed above state may not be able to produce accurate angle calculations around the time of a fault, when the fault has caused transient behaviour in the system. At such times, electrical characteristics in the system are not linear and so the first approach discussed above cannot be implemented.

Instead, a second approach that can operate in both transient and steady state conditions is now discussed with reference to FIGS. 5 and 6. This approach may be implemented in combination with, or separately to, the first approach.

In the second approach, angle computation unit 20 performs rotor/load angle calculations based on voltage angles, rather than voltage magnitudes. Angle computation unit 20 receives the three-phase voltage output 22 ($V_{snl}$) from the signalling generator 21 and the three-phase voltage 23 from the PCC 18 ($V_{pcc}$) or output terminal of generator 11 ($V_t$) terminal, and these are fed into a digital signal processor (DSP) 30. DSP 30 determines the voltage angle of the two signals, using the space vector method for example. The rotor angle or load angle δ is the difference between the voltage angle θ$_{snl}$ of the signal from the signalling generator 11 and the voltage angle θ$_{pcc/t}$ of voltage 23. The angle δ can output as a control signal 35 and or to a display 34 or some other output.

As shown in FIG. 6, angle computation unit 20 need not be limited to a single DSP 30. It may be convenient to install separate DSPs 30 to determine the voltage angle for the different signals. The determined voltage angles can then be collected together and compared to derive the rotor angle or load angle.

Using the approach based upon voltage angles, the rotor angle and/or load angle can still be computed with accuracy in transient periods, despite any change in the voltage magnitudes. Moreover, even over prolonged periods in which magnet strength may reduce, the rotor angle and/or load angle measurements based up on this approach would be unaffected, again because of its independence of voltage magnitude.

The invention claimed is:

1. A power system, comprising:
   a synchronous electrical generator having a rotor driven by a shaft;
   a permanent magnet signalling generator, coupled to the shaft; and
   an angle computation unit configured to calculate a rotor angle and/or load angle based on a voltage from the permanent magnet signalling generator and a voltage from the synchronous electrical generator.

2. A power system (10) according to claim 1, wherein a number of magnetic poles in the permanent magnet signalling generator (21) is the same as a pole number of the rotor of the synchronous electrical generator (11).

3. A power system according to claim 1, wherein a number of phases of the permanent magnet signalling generator is the same as a number of phases in a stator of the synchronous electrical generator.

4. A power system according to claim 1, wherein magnetic poles of the permanent magnet signalling generator are aligned with magnetic poles of the synchronous electrical generator.

5. A power system according to claim 1, wherein the angle computation unit is configured to calculate the rotor angle or load angle in one or both of steady state and transient conditions.

6. A power system according to claim 1, wherein the angle computation unit is configured to:
   receive the voltage from the permanent magnet signal generator at a first resistor via a variable resistor,
   receive the voltage from the synchronous electrical generator at a second resistor, first ends of each of the first and second resistors being connected to each other and ground,
   adjust the value of the variable resistor until the voltages over the first resistor and over the second resistor are equal, and
   calculate an angle (δ) using the equation:

$$\delta = \cos^{-1}\left(\frac{V_{a,snl}^2 + V_{a,pcc/t}^2 - V_{ag}^2}{2 \cdot V_{a,snl} V_{a,pcc/t}}\right)$$

wherein V$_{ag}$ is the voltage between the un-earthed ends of the first and second resistors.

7. A power system according to claim 1, wherein the angle computation unit comprises a digital signal processor.

8. A power system according to claim 7, wherein the digital signal processor is configured to:
   receive a three phase voltage from the permanent magnet signal generator, and determine a voltage angle for the permanent magnet signal generator;
   receive a three phase voltage from the synchronous electrical generator, and determine a voltage angle for the synchronous electrical generator; and
   calculate an angle as the difference between the voltage angle for the permanent magnet signal generator and the voltage angle for the synchronous electrical generator.

9. A power system according to claim 1, wherein the electrical power output from the synchronous electrical generator is less than 30 MW.

10. A power system according to claim 1, wherein the voltage from the synchronous electrical generator is the voltage at the point of common coupling to a load attached to the synchronous electrical generator or the voltage at an output terminal of the synchronous electrical generator.

11. A method of determining a rotor angle or load angle in a power system comprising synchronous electrical generator, the method comprising calculating the rotor angle or load angle based upon a voltage from a permanent magnet signalling generator coupled to a rotor shaft of the synchronous electrical generator.

12. A method of determining a rotor angle or load angle according to claim 11, wherein the power system is a power system.

13. A method of determining whether or not an out-of-step condition has occurred, the method comprising:
   determining a load angle and/or rotor angle of a generator system according to the method of claim 11; and
   determining whether or not an out-of-step condition has occurred depending upon the determined load angle and/or rotor angle.

14. A computer program that, when executed by a computing device, causes the computing device to determine a load angle and/or rotor angle in a power system according to the method of claim 11 and/or an out-of-step condition.

15. A computing device configured to determine a rotor angle in a power system and/or an out-of-step condition by executing the computing program of claim 14.

* * * * *